(12) United States Patent
Ramadurai et al.

(10) Patent No.: US 7,333,379 B2
(45) Date of Patent: Feb. 19, 2008

(54) BALANCED SENSE AMPLIFIER CIRCUITS WITH ADJUSTABLE TRANSISTOR BODY BIAS

(75) Inventors: Vinod Ramadurai, South Burlington, VT (US); Daryl Michael Seitzer, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 11/275,539

(22) Filed: Jan. 12, 2006

(65) Prior Publication Data

US 2007/0159899 A1 Jul. 12, 2007

(51) Int. Cl.
*G11C 7/02* (2006.01)

(52) U.S. Cl. .................. 365/208; 365/189.02; 365/207

(58) Field of Classification Search ........... 365/189.01, 365/189.02 X, 205, 207 X, 208 O, 189.02, 365/207, 208
See application file for complete search history.

(56) References Cited

U.S. PATENT DOCUMENTS

| 3,992,637 | A | 11/1976 | Cassidy et al. |
| 4,025,907 | A | 5/1977 | Karp et al. |
| 4,888,503 | A | 12/1989 | Young |
| 4,897,569 | A | 1/1990 | Calzl |
| 5,594,696 | A | 1/1997 | Komarek et al. |
| 6,191,976 | B1 | 2/2001 | Smayling et al. |
| 6,560,141 | B2 * | 5/2003 | Osada et al. ................. 365/154 |
| 6,600,690 | B1 | 7/2003 | Nahas et al. |
| 6,807,118 | B2 * | 10/2004 | Perner ........................ 365/209 |
| 2005/0018510 | A1 | 1/2005 | Terzioglu et al. |

\* cited by examiner

*Primary Examiner*—VanThu Nguyen
(74) *Attorney, Agent, or Firm*—Schmeiser, Olsen & Watts; Michael J. LeStrange

(57) ABSTRACT

Structures of balanced sense amplifier circuits and methods for operating the same. The structure comprises a reading circuit, which includes a first transistor and a second transistor. The first and second transistors comprise (i) a first transistor body and a second transistor body, respectively and (ii) a first transistor gate electrode and a second transistor gate electrode, respectively. The structure also comprises a control circuit, which is electrically coupled to the first and second transistor bodies. The structure further comprises a testing circuit, which is electrically coupled to the control circuit and the first and second transistors of the reading circuit. The testing circuit is capable of determining whether strengths of the first and second transistors are different. In response to the testing circuit determining that the strengths of the first and second transistors are different, the control circuit is capable of adjusting the voltage of the first transistor body.

1 Claim, 4 Drawing Sheets

BALANCED SENSE AMPLIFIER CIRCUITS WITH ADJUSTABLE TRANSISTOR BODY BIAS

BACKGROUND OF THE INVENTION

1. Technical Field

The present invention relates to sense amplifier circuits, and more specifically, to the sense amplifier circuits (sense amp circuits) that can be adjusted to be balanced.

2. Related Art

Due to process variation typical sense amplifier circuits often have mismatched devices, because the typical sense amplifier circuits often are unbalanced, resulting in read errors. Therefore, there is a need for sense amplifier circuits that can be adjusted to be balanced.

SUMMARY OF THE INVENTION

The present invention provides a digital circuit, comprising (a) a reading circuit, which includes a first transistor and a second transistor, wherein the first and second transistors comprise: (i) a first transistor body and a second transistor body, respectively and (ii) a first transistor gate electrode and a second transistor gate electrode, respectively; (b) a control circuit, which is electrically coupled to the first and second transistor bodies; and (c) a testing circuit, which is electrically coupled to the control circuit and the enable device of the reading circuit, wherein the testing circuit is capable of determining whether (i) strengths of the first and second transistors are different or (ii) the first and second transistors are of equal strength, and wherein, in response to the testing circuit determining that the strengths of the first and second transistors are different, the control circuit is capable of adjusting the voltage of the first or second transistor body.

The present invention also provides a circuit adjusting method, comprising providing a digital circuit, which includes (a) a reading circuit, which includes a first transistor and a second transistor, wherein the first and second transistors comprise: (i) a first transistor body and a second transistor body, respectively and (ii) a first transistor gate electrode and a second transistor gate electrode, respectively, (b) a control circuit, which is electrically coupled to the first and second transistor bodies, respectively, and (c) a testing circuit, which is electrically coupled to the control circuit and the first and second transistors of the reading circuit; using the testing circuit to determine, for a first balanced determination round, whether strengths of the first and second transistors are different; and in response to the testing circuit determining that the strengths of the first and second transistors are different, using the testing circuit to cause the control circuit to adjust the voltage of the first transistor body for a first time The present invention also provides a memory device, comprising (a) a memory cell array comprising N columns, wherein N is a positive integer greater than 1; (b) N sense amp circuits, wherein the N sense amp circuits are electrically coupled one-to-one to the N columns of the memory cell array, each of the N sense amp circuits comprising a first transistor and a second transistor, wherein the first and second transistors include: (i) a first transistor body and a second transistor body, respectively and (ii) a first transistor gate electrode and a second transistor gate electrode, respectively; (c) N control circuits, wherein the N control circuits are electrically coupled one-to-one to the N sense amp circuits, and wherein each of the N control circuits is electrically coupled to the first and second transistor bodies of the respective sense amp circuit; and (d) N testing circuits, wherein the N testing circuits are electrically coupled one-to-one to the N control circuits and the N sense amp circuits, wherein each of the N testing circuits is capable of determining whether (i) strengths of the first and second transistors of the respective sense amp circuit are different or (ii) the first and second transistors of the respective sense amp circuit are of equal strength, and wherein, in response to the testing circuit determining that the strengths of the first and second transistors of the respective sense amp circuit are different, the respective control circuit is capable of adjusting the voltage of the first transistor body of the respective sense amp circuit.

The present invention provides sense amplifier circuits that can be adjusted to be balanced.

DETAILED DESCRIPTION OF THE INVENTION

Figure 1:
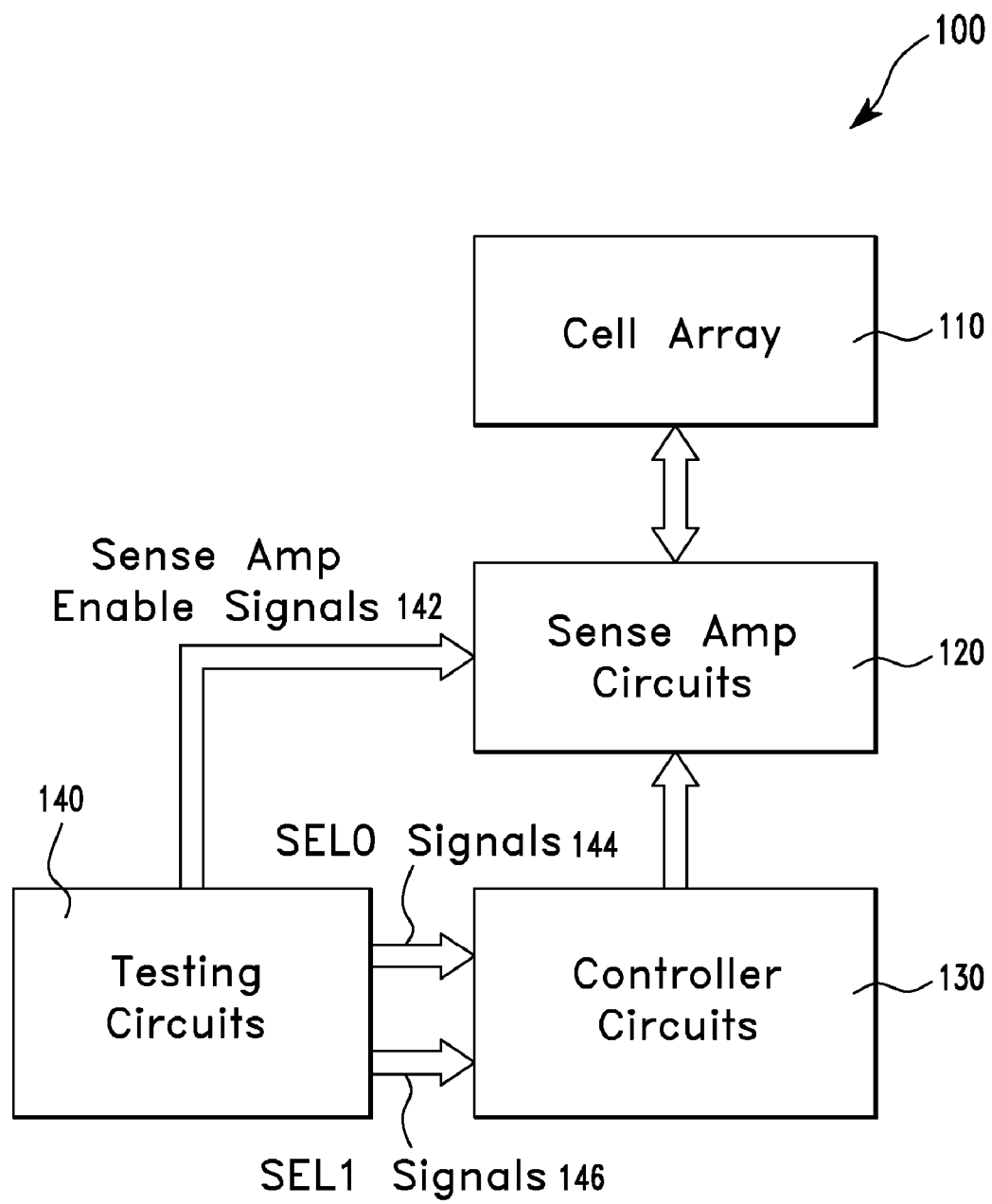
FIG. 1 shows a block diagram of a memory device, in accordance with embodiments of the present invention.

FIG. 1 illustrates a block diagram of a memory device 100, in accordance with embodiments of the present invention. Illustratively, the memory device 100 comprises a cell array 110, sense amp circuits 120 which are electrically coupled to the cell array 110, controller circuits 130 which are electrically coupled to the sense amp circuits 120, and testing circuits 140 which provide control signals to the sense amp circuits 120, and the controller circuits 130. More specifically, in one embodiment, the testing circuits 140 send sense amp enable signals 142 to the sense amp circuits 120. In one embodiment, the testing circuits 140 also send SEL0 signals 144 and SEL1 signals 146 to the controller circuits 130.

Figure 2:
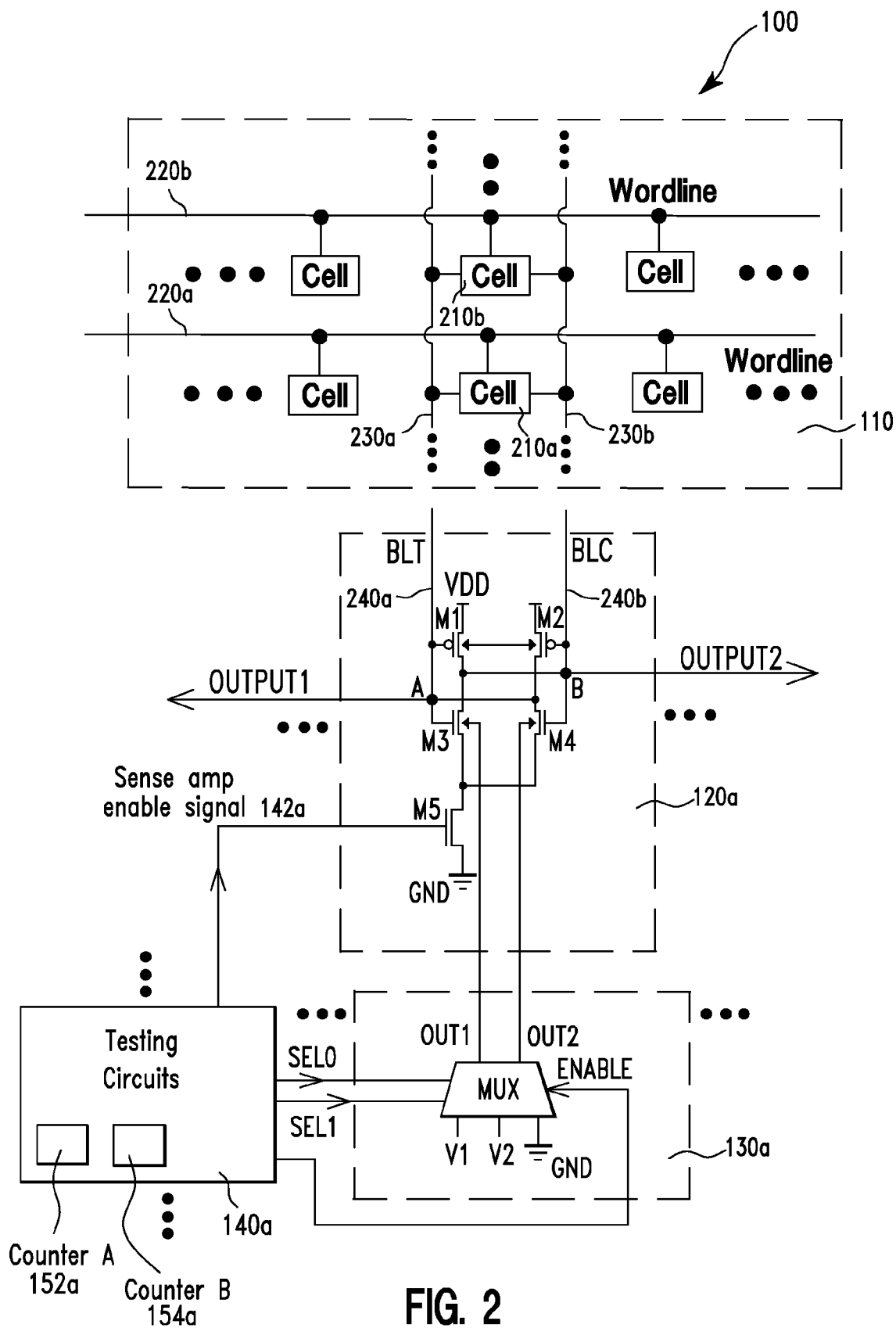
FIG. 2 shows a detail configuration of the memory device of FIG. 1, in accordance with embodiments of the present invention.

FIG. 2 illustrates a detail configuration of the memory device 100 of FIG. 1, in accordance with embodiments of the present invention. Illustratively, the cell array 110 comprises multiple word lines (e.g., word lines 220a and 220b). In one embodiment, the cell array 110 also comprises multiple bit line pairs (e.g., a bit line pair 230a,230b). In one embodiment, the bit line pair 230a,230b comprises two bit lines 230a and 230b (also called a bit line true (BLT) 230a and a bit line complement (BLC) 230b). The cell array 110 further comprises multiple cells (e.g., cells 210a and 210b) which are arranged in columns and rows. All cells of a same row are connected to a same word line and all cells of a same column are connected to a sense amp circuit via a bit line pair. Although the cell array 110 may have many rows and columns, only two rows and three columns of the cell array 110 are shown in FIG. 2. It should be noted that each row of the cell array 110 may comprise many cells. For illustration, only three cells of a same row are shown in FIG. 2. In one embodiment, the cell 210a can store one bit of information which can be a 0 or a 1.

In one embodiment, each of the cell columns of the cell array 110 is electrically coupled to a sense amp circuit of the sense amp circuits 120 via a bit line pair. Although the sense amp circuits 120 of FIG. 1 may comprise multiple sense amp circuits, only the sense amp circuit 120*a* is shown in FIG. 2. In one embodiment, the sense amp circuit 120*a* comprises five transistors M1, M2, M3, M4, and M5. In one embodiment, the transistors M1 and M2 are pFETs (P channel Field Effect Transistor) and the transistors M3 and M4 are nFETs (N channel Field Effect Transistor). In one embodiment, the transistor M5 (also called an enable transistor M5) plays the role of a lock to enable the sense amp circuit 120*a*. In one embodiment, the transistors M1 and M3 are coupled in series between Vdd and a source/drain electrode of the enable transistor M5. The gate electrodes of the transistors M1 and M3 are tied together to node A and connected to a bit line true (BLT) 240*a*. In one embodiment, the bit line true 240*a* is electrically coupled to the bit line true 230*a* via a switching circuit (not shown). This switching circuit allows the sense amp circuit 120*a* to connect to the cell 210*a* and the content of the cell 210*a* is read. In one embodiment, the transistor M1 is connected with the transistor M3 to form an inverter circuit M1+M3, whose input is node A, and whose output is node B. In one embodiment, the transistors M2 and M4 are coupled in series between Vdd and a source/drain electrode of the enable transistor M5. The gate electrodes of the transistors M2 and M4 are tied together to node B and connected to a bit line complement (BLC) 240*b*. In one embodiment, the bit line complement 240*b* is electrically coupled to the bit line complement 230*b* via the switching circuit (not shown). In one embodiment, the transistor M2 is connected with the transistor M4 to form an inverter circuit M2+M4, whose input is node B, and whose output is node A. As a result, the two inverters M1+M3 and M2+M4 are a cross coupled to form a latch (or a bit register) which can store one bit of information (0 or 1).

In the embodiments described above, each of the cell columns is electrically coupled to a sense amp circuit. In an alternative embodiment, multiple cell columns are electrically coupled to a sense amp circuit.

Assume that the cell 210*a* is selected. The function of the sense amp circuit 120*a* is to receive the content of the selected cell 210*a* via the bit line pair 230*a*,230*b*. Then the sense amp circuit 110 amplifies the content of the selected cell 210*a* and sends it to an output circuit (not shown) through lines OUTPUT1 and OUTPUT2. Because of the construction of the sense amp circuit 120*a*, the voltages of node A and node B are at different logic. More specifically, if one of the voltages of node A and node B is 0V, then the sense amp circuit 110 causes the other to be 5V. In one embodiment, node A of the sense amp circuit 120*a* being at 0V and node B of the sense amp circuit 120*a* being at 5V mean that the sense amp circuit 120*a* reads a 0 from the cell 210*a*, whereas the node A of the sense amp circuit 120*a* being at 5V and the node B of the sense amp circuit 120*a* being at 0V mean that the sense amp circuit 120*a* reads a 1 from the cell 210*a*. In one embodiment, the structure and operation of the other sense amp circuits of the sense amp circuits 120 are similar to the structure and operation of the sense amp circuit 120*a*.

In one embodiment, each of the sense amp circuits 120 is electrically coupled to a controller circuit of the controller circuits 130. Although the controller circuits 130 of FIG. 1 may comprise multiple controller circuits, only a controller circuit 130*a* is shown in FIG. 2. In one embodiment, the controller circuit 130*a* comprises a MUX (multiplexer) 250. Illustratively, the MUX 250 comprises output signals OUT1 and OUT2; input signals V1, V2, and GND (0V); and control signals SEL0, SEL1, and ENABLE. In one embodiment, the output signals OUT1 and OUT2 of the controller circuit 130*a* are connected to the bodies of the transistors M3 and M4, respectively. In one embodiment, the inputs of the MUX 250 are voltage signals V1, V2, and a ground signal GND wherein V2>V1>0V.

In the embodiments described above, the output signals OUT1 and OUT2 of the controller circuit 130*a* are connected to the bodies of the transistors M3 and M4, respectively. In an alternative embodiment, the output signals OUT1 and OUT2 of the controller circuit 130*a* are connected to the bodies of the transistors M1 and M2, respectively. In yet another alternative embodiment, the MUX 250 comprises four output signals OUT1, OUT2, OUT3, and OUT4 which are connected to the bodies of the transistors M1, M2, M3, and M4, respectively.

In one embodiment, the function of the controller circuit 130*a* of FIG. 2 is to provide appropriate voltages to the bodies of the transistor M3 and M4 via the output signals OUT1 and OUT2, respectively. Each of the output signals OUT1 and OUT2 can be the voltage of V1, V2, or GND (also called strength adjusting voltages). In one embodiment, if the control signal ENABLE is at the voltage of low level, both the output signals OUT1 and OUT2 receive the voltage of GND. In one embodiment, if the control signal ENABLE is at the voltage of high level, the MUX 250 receives the control signals SEL0 and SEL1 (binary bit signals) to provide 4 cases of pair of voltages (0 and V1), (0 and V2), (V1 and 0), and (V2 and 0) to the output signals OUT1 and OUT2, respectively. The structure and operation of the other controller circuits of the controller circuits 130 are similar to the structure and operation of the controller circuit 130*a*.

In one embodiment, each of the sense amp circuits 120 and the respective controller circuit of the controller circuits 130 are controlled by a testing circuit of the testing circuits 140. Although the testing circuits 140 of FIG. 1 may comprise multiple testing circuits, only a testing circuit 140*a* is shown in FIG. 2. In one embodiment, the testing circuit 140*a* comprises a counter A and a counter B. In one embodiment, the testing circuit 140*a* provides sense amp enable signal 142*a* to the gate electrode of the enable transistor M5. In one embodiment, the testing circuit 140*a* provides the control signals SEL0 and SEL1 to the controller circuit 130*a* to apply appropriate voltages to the bodies of the transistor M3 and M4 via the output signals OUT1 and OUT2, respectively.

Figure 3:
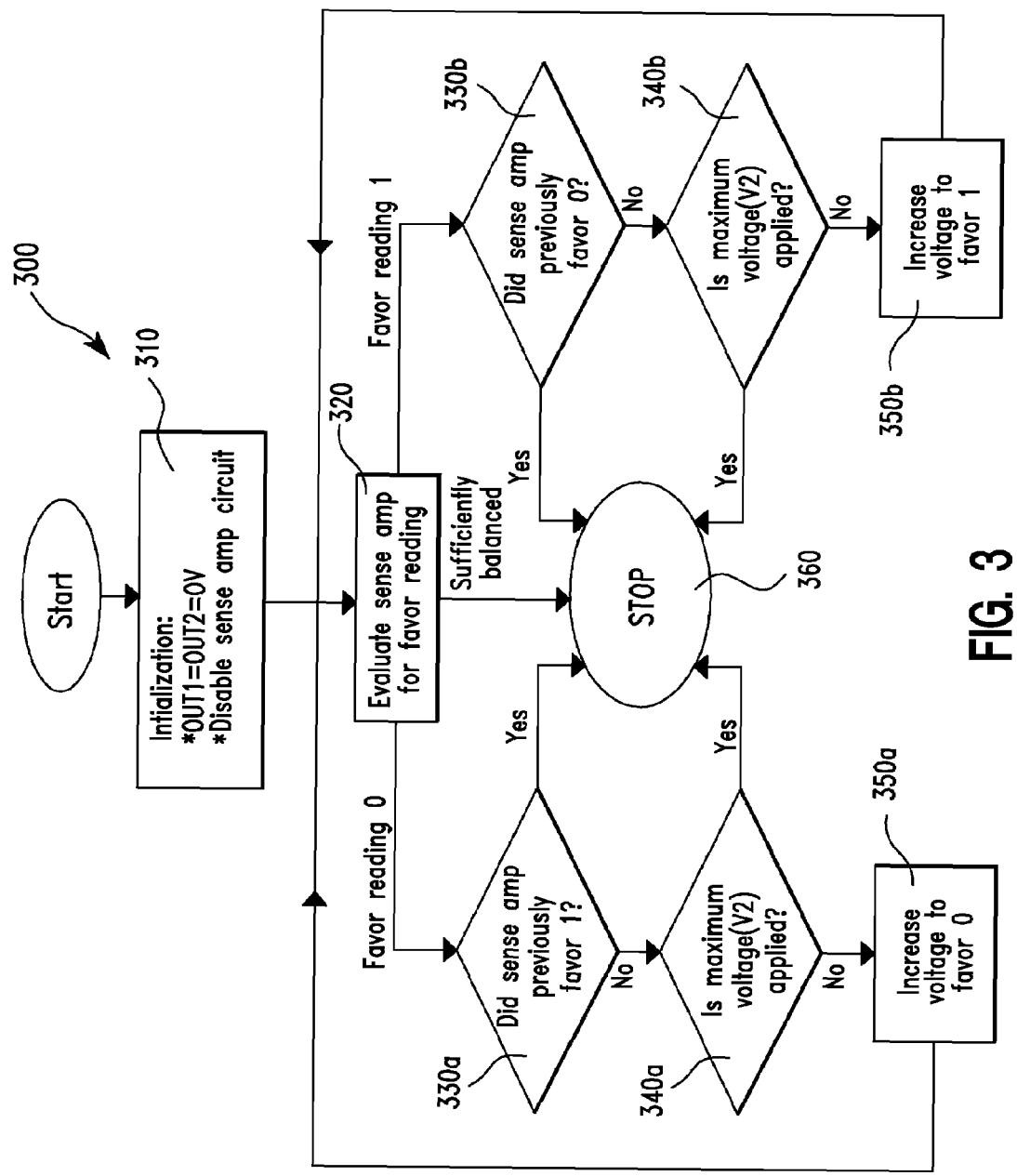
FIGS. 3 and 4 show flowcharts that illustrate a sense amp adjustment operation for adjusting a sense amp of the memory device of FIG. 2, in accordance with embodiments of the present invention.

In one embodiment, FIG. 3 shows a flowchart that illustrates a sense amp adjustment operation 300 (or in short an operation 300) for adjusting the sense amp 120*a* of the memory device 100 of FIG. 2. In general, the operation 300 of the memory device 100 of FIG. 2 is as follows. On power-up, the testing circuit 140*a* of FIG. 2 tests the sense amp circuit 120*a* to determine whether the sense amp circuit 120*a* favors reading a 1 or a 0 (unbalanced problem). After that, if the sense amp circuit 120*a* favors reading a 1, then the testing circuit 140*a* controls the controller circuit 130*a* to apply the appropriate voltages to the bodies of the transistors M3 and M4 so as to make the sense amp circuit 120*a* less favoring reading a 1 and therefore to make the sense amp circuit 120*a* more balanced. If the sense amp circuit 120*a* favors reading a 0, then the testing circuit 140*a* controls the controller circuit 130*a* to apply the appropriate voltages to the bodies of the transistors M3 and M4 so as to make the sense amp circuit 120*a* less favoring reading a 0 and therefore to make the sense amp circuit 120*a* more balanced.

In one embodiment, the detailed sense amp adjustment operation 300 of the memory device 100 is as follows. In one embodiment, the operation 300 starts with an initialization step 310, in which the output signals OUT1 and OUT2 (FIG. 2) are initialized to 0V (GND) and the sense amp circuit 120*a* is disabled by turning off the transistor M5 (FIG. 2). Next, in one embodiment, in step 320 (also called a balanced determination round 320), the testing circuit 140*a* for the first time evaluates whether the sense amp circuit 120*a* of FIG. 2(*a*) is balanced, (b) favors reading a 0, or (c) favors reading a 1. In other words, the balanced determination round 320 is performed for the first time.

Figure 4:
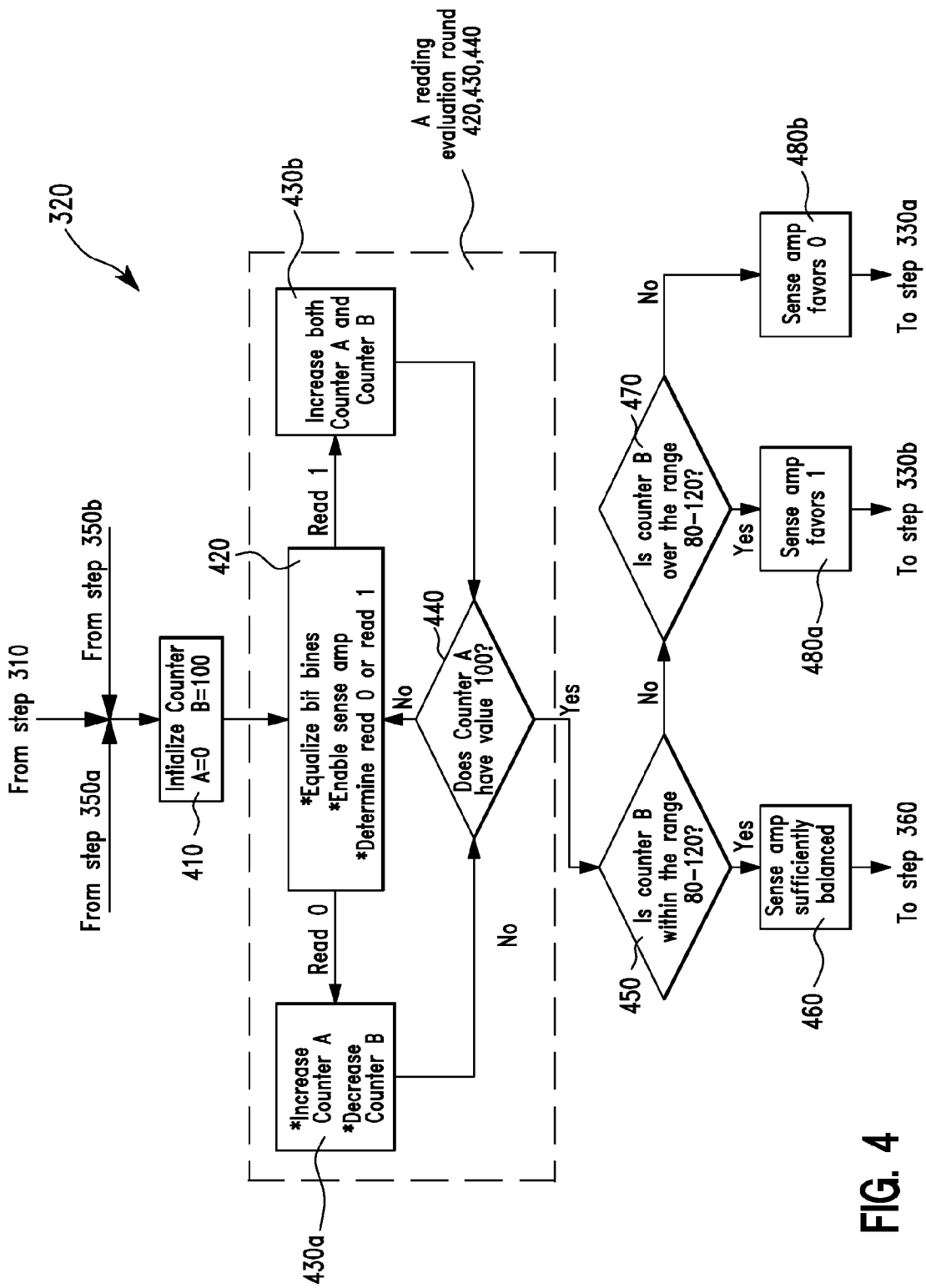

More specifically, with reference to FIG. 4, the step 320 of FIG. 3 comprises multiple steps. In one embodiment, in step 410, the counter A of FIG. 2 is initialized to 0 and the counter B of FIG. 2 is initialized to n (n is a positive integer). In one embodiment, n is equal to 100.

Next, in one embodiment, a reading evaluation round 420,430,440 (comprising four steps 420, 430*a*, 430*b*, and 440) is started for the first time with step 420 of FIG. 4. In one embodiment, in step 420, the voltages of the BLT 240*a* and BLC 240*b* are equalized to the voltage of high level (5V) by an equalizing circuit (not shown) and then the sense amp circuit 120*a* is enabled by turning on the transistor M5. Therefore, the transistors M3 and M4 are turned on, so the voltages of node A and node B decrease toward 0V (GND). Assume in this first reading evaluation round 420,430,440 that, the voltage of node A decreases faster and down to 0V causing the voltage of the node B is up to 5V. As a result, a 0 is read and therefore the step 430*a* is performed. In one embodiment, in step 430*a*, the counter A is increased by 1 and the counter B is decreased by 1, and then, the step 440 is performed. However, in this first reading evaluation round 420,430,440, if the voltage of node B decreases faster and down to 0V causing the voltage of the node A is up to 5V, a 1 is read and therefore the step 430*b* is performed. In one embodiment, in step 430*b*, both of the counter A and the counter B are increased by 1, and then, the step 440 is performed.

In one embodiment, in step 440, the testing circuit 140*a* evaluates whether the counter A has reached 100. If the counter A has reached 100, the step 450 is performed. If the counter A has not reached 100, then the step 420 is performed again (i.e. the reading evaluation round 420,430,440 is performed for the second time) as stated above and so on. In one embodiment, the following reading evaluation rounds 420,430,440 are similar to the first reading evaluation round 420,430,440 until the counter A reaches 100.

In one embodiment, in step 450, the testing circuit 140*a* determines whether the content of the counter B is within a pre-specified range. In one embodiment, the pre-specified range is from 80 to 120. If the counter B is within the range of 80-120, it is determined in step 460 that the sense amp circuit 120*a* is balanced (in other words, the transistors M3 and M4 are of equal strength) and then, with reference to FIG. 3, the operation 300 stops as shown in step 360 and the voltages of the output signals OUT1 and OUT2 stay at 0V (GND). In contrast, if the counter B is not within the range of 80-120 (in other words, it can be said that the strengths of the transistors M3 and M4 are different), then the step 470 is performed. It should be noted that the strength of each of the transistors M3 and M4 is defined as the transistor's conductivity. The strengths of the transistors M3 and M4 are considered different if the counter B is not within a pre-specified range (e.g., the range of 80-100 as in the embodiment above). The transistors M3 and M4 are considered of equal strength if the counter B is within the pre-specified range.

In one embodiment, in step 470, the testing circuit 140*a* determines whether the counter B is over the range of 80-120. If the counter B is over the range of 80-120 (greater than 120), it is determined in step 480*a* that the sense amp circuit 120*a* favors reading a 1 (i.e. the transistor M3 is stronger than the transistor M4 (assume that the transistors M1 and M2 are equal strength)). In contrast, if the counter B is under the range of 80-120 (less than 80), it is determined in step 480*b* that the sense amp circuit 120*a* favors reading a 0 (i.e. the transistor M4 is stronger than the transistor M3 (assume that the transistors M1 and M2 are equal strength)).

In one embodiment, on the one hand, after the balanced determination round 320 is performed for the first time, if the sense amp circuit 120*a* is determined to favor reading 0 as shown in step 480*b* (FIG. 4), then the step 330*a* is performed. In one embodiment, in step 330*a*, the testing circuit 140*a* determines whether the sense amp circuit 120*a* was previously determined to favor reading 1. If yes, the operation 300 stops as shown in step 360. If the sense amp circuit 120*a* was not previously determined to favor reading 1, then step 340*a* is performed.

In one embodiment, in step 340*a*, it is determines whether the body of transistor M4 received maximum voltage (V2). If yes, the operation 300 stops as shown in step 360. In contrast, if the body of transistor M4 received a voltage less than the maximum voltage (V2), step 350*a* is performed.

In one embodiment, in step 350*a*, the voltage applied to the body of transistor M4 is increased to a next higher voltage and then the balanced determination round 320 is performed again for a second time and so on, until the operation 300 stops.

In one embodiment, on the other hand, after the balanced determination round 320 is performed for the first time, if the sense amp circuit 120*a* is determined to favor reading 1 as shown in step 480*a* (FIG. 4), then the step 330*b* is performed. In one embodiment, in step 330*b*, the testing circuit 140*a* determines whether the sense amp circuit 120*a* was previously determined to favor reading 0. If yes, the operation 300 stops as shown in step 360. If the sense amp circuit 120*a* was not previously determined to favor reading 0, then step 340*b* is performed.

In one embodiment, in step 340*b*, it is determines whether the body of transistor M3 received maximum voltage (V2). If yes, the operation 300 stops as shown in step 360. In contrast, if the body of transistor M3 received a voltage less than the maximum voltage (V2), step 350*b* is performed.

In one embodiment, in step 350*b*, the voltage applied to the body of transistor M3 is increased to a next higher voltage and then the balanced determination round 320 is performed again for a second time and so on, until the operation 300 stops.

In summary, on power-up, in step 320 (the balanced determination round 320 in FIG. 3 and FIG. 4), the testing circuit 140*a* of FIG. 2 tests the sense amp circuit 120*a* through 100 reading evaluation rounds 420,430,440 to determine whether the sense amp circuit 120*a* favors reading a 1 or 0. Next, depending on the result of the balanced determination round 320, the testing circuit 140*a* controls the control circuit 130*a* to mitigate for the unbalanced problem of the sense amp 120*a*.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A circuit adjusting method, comprising:
   providing a digital circuit, which includes:

(a) a reading circuit, which includes a first transistor and a second transistor, wherein the first and second transistors comprise: (i) a first transistor body and a second transistor body, respectively and (ii) a first transistor gate electrode and a second transistor gate electrode, respectively, (b) a control circuit, which is electrically coupled to the first and second transistor bodies, respectively, and (c) a testing circuit, which is electrically coupled to the control circuit and the first and second transistors of the reading circuit;

using the testing circuit to determine, for a first balanced determination round, whether strengths of the first and second transistors are different; and in response to the testing circuit determining that the strengths of the first and second transistors are different, using the testing circuit to cause the control circuit to adjust the voltage of the first transistor body for a first time, wherein the control circuit comprises a multiplexer, wherein the multiplexer includes a first multiplexer output node and a second multiplexer output node, wherein the first multiplexer output node is electrically coupled to the first transistor body, and wherein the second multiplexer output node is electrically coupled to the second transistor body.

* * * * *